United States Patent

Harada et al.

[11] Patent Number: 6,120,586
[45] Date of Patent: Sep. 19, 2000

[54] METAL COMPOSITION CONTAINING METAL ACETYLIDE, BLANK HAVING METALLIC COATING FORMED THEREWITH, AND METHOD FOR FORMING THE METALLIC COATING

[75] Inventors: Akio Harada; Yoshiki Okamoto, both of Osaka, Japan

[73] Assignee: Daiken Chemical Co., Ltd., Osaka, Japan

[21] Appl. No.: 09/341,373

[22] PCT Filed: Nov. 13, 1998

[86] PCT No.: PCT/JP98/05139

§ 371 Date: Jul. 1, 1999

§ 102(e) Date: Jul. 1, 1999

[87] PCT Pub. No.: WO99/27159

PCT Pub. Date: Jun. 3, 1999

[51] Int. Cl.[7] .......................................... B22F 7/00
[52] U.S. Cl. .......................... 106/1.25; 106/1.26; 106/1.28
[58] Field of Search ................... 106/1.25–1.28; 427/125, 126.3–126.6, 229, 383.1–383.7

[56] References Cited

U.S. PATENT DOCUMENTS 4,098,807  7/1978  Green et al. .
5,100,702  3/1992  Maeda et al. ........................... 427/229

FOREIGN PATENT DOCUMENTS 51-86451  7/1976  Japan .
116724  9/1981  Japan .
129227  10/1981  Japan .
3-247772  11/1991  Japan .

*Primary Examiner*—Brian K. Talbot
*Attorney, Agent, or Firm*—Koda & Androlia

[57] ABSTRACT

A metallic composition such as a metal liquid, metal paste, etc. is manufactured by using a metal acetylide compound expressed by the general formula $M(-C\equiv C-R)_n$ (in the formula, M indicates a metal atom, n indicates the valence number of the metal atom M, and R is a hydrocarbon group which may or may not contain oxygen atoms) as an organometal source, and by mixing and kneading an organic solvent and/or a resin together with such a metal acetylide compound. When this metallic composition is applied in a desired pattern to prescribed portions of electronic elements or ornamental items such as porcelain vessels or glass, etc., and at least these prescribed portions are dried and heated, the result is that the organic substances other than the metal are broken down and released, and the metal alone is sintered in the pattern. This pattern shows an ornamental metallic luster in the case of ornamental items, and forms electrodes in the case of electronic elements. Since the metal acetylide compounds do not contain sulfur or halogen elements, these compounds do not release environmental contaminants such as sulfurous acid gas, halogen gases, etc. even when fired; accordingly, such compounds can contribute to the cleaning of the environment. Furthermore, since these compounds have a high solubility in organic solvents, they are suitable as raw materials in metallic compositions. Moreover, the metallic film that is formed after firing is smooth and finely textured and has a high metallic luster and electrical conductivity; accordingly, this film can form high-quality ornamental films in ornamental items and electrodes in electronic component, etc.

2 Claims, No Drawings

6,120,586

METAL COMPOSITION CONTAINING METAL ACETYLIDE, BLANK HAVING METALLIC COATING FORMED THEREWITH, AND METHOD FOR FORMING THE METALLIC COATING

TECHNICAL FIELD

The present invention relates to a metal composition for forming metallic films such as electrodes or ornamental films, etc. on the surfaces of base materials and to an application method of such a metal composition. More specifically, the present invention relates to a metal composition which uses metal acetylide compounds that contain no sulfur or halogens, etc., as organo-metallic agents, and which therefore does not generate gases harmful to the environment such as $SO_x$, $Cl_2$, etc., when the resulting metallic film is fired, so that the environment can be kept clean, and the invention further relates to an application method of a metal composition.

BACKGROUND ART

Ordinarily, in cases where electrodes are formed on insulating substrates or electronic elements, etc., a known method is that an organo-metallic paste is first prepared by mixing and kneading a powdered metal or organo-metal complex with a resin or organic solvent, etc.; this organo-metallic paste is applied to the surface of the insulating substrate or electronic element by a method such as screen printing, etc., so that a specified circuit pattern is formed; and then this pattern area is heated so that the organic component is broken down and evaporated, thus depositing the metal in the form of a film. Furthermore, in cases where ornamental metallic films are formed on the surfaces of ceramics, etc., since a metal liquid which has little viscosity is required, an organo-metal complex which is soluble in organic solvents is selected, and an organo-metal liquid is prepared by dissolving or dispersing this complex in such an organic solvent. As seen from the above, organo-metal complexes are currently used in a broad range of fields such as electronic instruments, ceramics and industrial arts, etc.

Conventionally, balsam type compounds, e.g., terpineolgold sulfide ($C_{10}H_{18}SAuCl_x$), terpineolplatinum sulfide ($C_{10}H_{18}SPtCl_x$) and terpineolpalladium sulfide ($C_{10}H_{18}SPdCl_x$), etc. have been known as organo-metal complexes used in such applications. These compounds are also referred to in abbreviated form as gold balsam, platinum balsam and palladium balsam. In addition, other noble metal balsams such as rhodium balsam and ruthenium balsam, etc. are also known.

When such conventional balsam type compounds are used as raw materials for metal compositions such as metal pastes and metal liquids, etc., the problems described below are still encountered.

First of all, in cases where metals are to be deposited using such metal compositions, a firing process cannot be avoided in the manufacturing process. Since balsam type compounds contain chlorine and sulfur, $SO_x$ and $Cl_2$ are inevitably produced as by-products in the firing process; and when these harmful substances are released into the atmosphere, this not only causes a deterioration in the health environment of the workers, but also has a deleterious effect on the natural environment in general. Furthermore, extensive equipment such as desulfurizing equipment, etc. is required in order to recover these harmful substances, and 100% recovery of the substances is difficult. $SO_x$ and halogens may also damage the equipment used for firing, so that there is a need for safer metal compositions for forming metallic films.

Secondly, the $SO_x$ and halogens generated during firing may in some cases have a deleterious effect on the base material being fired. When the base material is heated, components other than metals are broken down and evaporated; however, $SO_x$ and halogens may corrode the base material, and in some case, sulfur atoms and halogen atoms may be diffused as impurities inside the base material. Especially in cases where the base material constitutes an electronic element, there have been instances in which such diffusion has a deleterious effect on the electronic characteristics of this electronic element.

Third, there are limits to the organic solvents that can be used in cases where organo-metal liquids are manufactured from balsam type compounds. For example, such compounds show a high solubility in aromatic solvents, but are almost insoluble in alcohol type solvents. Furthermore, the same limitations also apply to the resins that are required in order to manufacture an organo-metal paste. For example, in cases where the resin used is a nitrocellulose resin, this resin is soluble in solvents such as butylcarbitol and butylcarbitol acetate, etc. but is insoluble in terpineol. Accordingly, if the solvents are limited on the organo-metal complex side, the resins that can be used are also naturally limited; consequently, the types of metal pastes that can be manufactured are limited, and the applications of these pastes are also limited.

DISCLOSURE OF THE INVENTION

The present invention was devised in order to solve the above-described drawbacks; and the present invention proposes the use of metal acetylide compounds containing no sulfur or chlorine as organo-metal complexes constituting the chief component of a metal composition. These metal acetylide compounds are expressed by the general formula $M(-C\equiv C-R)_n$ (wherein, M indicates a metal atom, n indicates the valence number of the metal atom M, and R indicates a hydrocarbon group which may or may not contain an oxygen atom), and they do not contain sulfur or halogens as constituent elements.

A metallic composition, in which the above-described metal acetylide compounds are dissolved or dispersed in an organic solvent and are thus converted into the form of an organo-metal liquid, is proposed. Furthermore, a metallic composition, in which the above metal acetylide compounds, a resin which adjusts the viscosity and an organic solvent are kneaded together to form an organo-metal paste, is proposed. Moreover, a metallic composition, which contains additives that heighten the adhesion of the metal film, is proposed. Furthermore, a metallic composition, which contains a plurality of metal acetylide compounds with different metallic elements, is proposed.

Further, a method for forming a metallic film is proposed in which one of the above-described metallic compositions is applied in a prescribed pattern to the surface of a base material so that a metallic composition film is formed, this metallic composition film is heated so that the substances other than the metal are broken down and evaporated and so that the metal is simultaneously sintered, thus forming a finely textured metallic film. Furthermore, a base material, which has a metallic film with a prescribed pattern formed on its surface by the above-described method, is proposed.

The present inventors diligently studied organo-metal complexes which contain no sulfur or halogens that cause environmental contamination and which are soluble in numerous organic solvents. As a result of this research, the inventors found that metal acetylide compounds which are a type of acetylene derivatives are suited to the object of the present invention. The present invention is based upon this finding.

More specifically, the organo-metal complexes used in the present invention are acetylide compounds expressed by the general formula $M(-C\equiv C-R)_n$. In this general formula, M indicates a metal atom which may be selected from a broad range of metallic elements such as Bi, Cu, In, Ni, Ru, Rh, Pd, Ag, Os, Ir, Pt or Au, etc. Noble metals with a high stability are commonly used in metallic compositions such as organo-metal liquids or organo-metal pastes, etc. Here, the term "noble metals" refers to Au, Ag and metallic elements of the platinum group (Ru, Rh, Pd, Os, Ir, Pt).

In the above general formula, n indicates the valence number of the metal atom M; and for example, Au has monovalent and trivalent forms, Ag has monovalent and divalent forms, and Pt has divalent, tetravalent and hexavalent forms, etc. In other words, not only does this value vary according to the type of metallic elements involved, but specified metallic elements may have a plurality of valence numbers.

Further, R in the ligand —C≡C—R of the metal acetylide compounds is a hydrocarbon group which may or may not contain oxygen atoms. The constituent elements of this group are C and H, or C, H and O. The number of carbon atoms in the hydrocarbon group R is preferably 1 to 8; accordingly, the number of carbon atoms in the ligand as a whole is preferably 3 to 10. The reasons for this are as follows: namely, in cases where the number of carbon atoms is small, the metal acetylide compounds do not readily dissolve in solvents; at the same time, the explosive properties are increased so that handling becomes dangerous. On the other hand, in cases where the number of carbon atoms in the ligand is large, the metal weight in the substance becomes relatively small, so that a metal film cannot be formed when this substance is formed into an organo-metal liquid or organo-metal paste. In other words, when the metal acetylide compounds of the present invention are utilized in a metallic composition, it is necessary that these compounds be soluble in solvents and the compounds have a fixed metal weight. Thus, a ligand —C≡C—R with 3 to 10 carbon atoms results in a metal acetylide compound which is readily soluble in solvents and which has a relatively large metal weight, so that such a compound can be adequately used in a metallic composition.

Aliphatic hydrocarbon groups which contain oxygen in the form of hydroxy groups may be used as the hydrocarbon group R when this hydrocarbon group contains oxygen. In this case, the group may be linear or may have side chains. Examples of the ligand —C≡C—R, more concretely in the form H—C≡C—R, include: propyne, 2-propyn-1-ol, 1-butyn-3-ol, 3-methyl-1-butyn-3-ol, 3,3-dimethyl-1-butyne, 1-pentyne, 1-pentyn-3-ol, 4-pentyn-1-ol, 4-pentyn-2-ol, 4-methyl-1-pentyne, 3-methyl-1-pentyn-3-ol, 3,4-dimethyl-1-pentyn-3-ol, 1-hexyne, 1-hexyn-3-ol, 5-hexyn-1-ol, 5-methyl-1-hexyne, 5-methyl-1-hexyn-3-ol, 3,5-dimethyl-1-hexyn-3-ol, 1-heptyne, 1-heptyn-3-ol, 5-heptyn-3-ol, 3,6-dimethyl-1-heptyn-3-ol, 1-octyne and 1-octyn-3-ol, etc.

Furthermore, examples of the hydrocarbon group R include hydrocarbon groups which contain at least a cyclic hydrocarbon containing oxygen in the form of a hydroxy group when the hydrocarbon group R contains oxygen. Such hydrocarbon groups may contain a cyclic hydrocarbon group in the principal chain or may contain a cyclic hydrocarbon group in a side chain. Furthermore, R as a whole may also be a cyclic hydrocarbon. Here, concrete examples of the ligand —C≡C—R, in the form H—C≡C—R, include: 1-ethynyl-1-cyclopropanol, 1-ethynyl-1-cyclobutanol, 1-ethynyl-1-cyclopentanol, 1-ethynyl-1-cyclohexanol, 1-propyne-3-cyclopropanol, 1-propyne-3-cyclobutanol, 1-propyne-3-cyclopentanol, 1-butyne-4-cyclopropanol, 1-butyne-4-cyclobutanol, and 1-pentyne-5-cyclopropanol, etc.

As described above, the metal acetylide compounds of the present invention comprises only metallic elements, carbon, hydrogen and/or oxygen. Even if these compounds are decomposed by firing, the only gases evolved are carbon dioxide, water vapor and some hydrocarbons depending on the firing temperature; and no substances harmful to the environment, such as $SO_x$ or halogen gases, etc. are produced. Accordingly, these compounds are organo-metal complexes that are extremely safe and clean with respect to the environment and living organisms.

The metallic compositions according to the present invention is classified into organo-metal liquids and organo-metal pastes. Organo-metal liquids are formed by dissolving/dispersing the metal acetylide compounds constituting the organo-metal complexes in an organic solvent; and these compositions are ordinarily liquid. Organo-metal pastes are formed by mixing metal acetylide compounds and a resin used for viscosity adjustment with an organic solvent; and these compositions have an increased or decreased viscosity depending on the manner of use. Metallic compositions in liquid form with a small viscosity may be referred to as either organo-metal liquids or organo-metal pastes; and the boundary between these two types of compositions is not clearly defined.

Unlike conventional balsam type compounds, metal acetylide compounds dissolve in a broad range of organic solvents, both polar and non-polar. Concrete examples of organic solvents that can be used include: petroleum type solvents, terpineol, butylcarbitol, esters such as ethyl lactate, etc., cellosolves, alcohols, aromatic compounds, DEP (diethyl phthalate), etc.

The viscosity of organo-metal pastes varies according to the conditions of coating (conditions of printing) on the base material, the firing conditions and the state of the surface following firing; and therefore, a resin is mixed with the composition in order to adjust this viscosity. The resin used in this case must be easily dissolved/dispersed in organic solvents along with the metal acetylide compounds. Metal acetylide compounds are readily dissolved in many organic solvents; accordingly, the range of resins that can be dissolved/dispersed in these organic solvents is broader than in the case of conventional balsam type compounds. For example, ethylcellulose, nitrocellulose, asphalt, butyral, acryl copaiba balsam, dammar, etc. and related substances may be utilized as resins.

The above-described metal acetylide compounds and organic solvents are mixed so as to produce organo-metal liquids. In this case, it is desirable that the amount of metal acetylide compound used be 60 parts by weight to 10 parts by weight, and that the amount of organic solvent used be 30 parts by weight to 90 parts by weight; and 10 parts by weight to 1 part by weight of the additives described below are mixed with this composition. Furthermore, very small amounts of resins can be added in some cases. If the amount of metal acetylide compound used is smaller than the amount described above, the metal weight will be small, and a metallic film cannot be formed. On the other hand, if the amount of metal acetylide compound used is larger than the amount described above, the compound will not be dispersed in the organic solvent and will instead precipitate. Accordingly, the above-described range produces a good organo-metal liquid. The amount is set at an appropriate amount in accordance with conditions such as the base material on which the metallic film is to be formed, the heating temperature, the film thickness, etc.

Furthermore, an organo-metal paste is manufactured by mixing the metal acetylide compounds, an organic solvent and a resin. In this case, it is desirable that the mixture proportions of the composition be 60 parts by weight to 10 parts by weight of a metal acetylide compound, 30 parts by weight to 85 parts by weight of an organic solvent, and 3 parts by weight to 30 parts by weight of a resin. If necessary, additives may be added at the rate of 1 part by weight to 10 parts by weight.

The viscosity of organo-metal pastes manufactured in the above range is 50 p (poise) to 5,000 p (poise). If the viscosity is lower than the lower limit value of this range, the organo-metal paste will be close to an organo-metal liquid; and if the viscosity exceeds the upper limit value of the above-described range, it becomes difficult to make the resulting film thin when the metallic composition is applied to the surface of the base material. The viscosity of such organo-metal pastes is freely altered in accordance with the application involved.

When the organo-metal liquid or organo-metal paste is manufactured, the necessary components are selected from the above-described metal acetylide compounds, organic solvents, resins and additive; and the necessary amounts of these components are put in a container and uniformly dissolved/dispersed by means of a kneading device. This mixed liquid is passed through a single stage or multiple stages of meshes, so that debris and large particles are removed. As a result, a fine uniformly dissolved or dispersed organo-metal liquid or organo-metal paste is obtained. The metal acetylide compounds dissolve very readily in organic solvents compared to conventional organo-metal complexes; accordingly, a uniformly dissolved or dispersed metallic composition can be obtained by means of the simple mixing and agitation process described above.

A metallic composition film is formed on the surface of a base material using the organo-metal liquid or organo-metal paste obtained by the above manufacturing method. Various objects may be used as the base material. The present invention is not limited to specified objects, and an extremely broad range of objects can be treated by the present invention. For example, such objects include items ranging from decorative objects such as ceramics, tiles, glass products, etc. to electronic elements, e. g., electrodes used in thermal heads of printers, etc.

In order to form a metallic composition film with a specified pattern on the surface of a base material using the organo-metal liquid, simple painting with a brush or dipping, etc. may be employed. Furthermore, in the case of the metal paste, methods such as screen printing, pad printing, transfer or dipping, etc. may be used.

The metallic composition film is next fired so that a metallic film is formed. The base material as a whole may be placed in a heating oven and heated to the firing temperature, or only the metallic composition film portion on the surface of the base material may be locally heated by means of a gas burner, etc. When firing is performed, the organic solvent, resin, additives and ligands other than the metal in the metal acetylide are thermally decomposed and evaporated, and a metallic film is formed as the remaining metal atoms bond to each other and grow. This metal film appropriately functions in accordance with the intended use, e. g., an ornamental film in the case of ornamental products, and an electrode in the case of electronic components.

The metallic composition of the present invention has the following special features. First, since this composition contains no sulfur or chlorine, there is no release of harmful substances such as sulfur or chlorine in the firing stage. Thus, the composition is clean with respect to the environment, and an equipment such as desulfurizing apparatus, etc. is unnecessary.

Secondly, the decomposition temperature of the metal acetylide compounds is approximately 400° C., which is slightly lower than the decomposition temperatures of conventional organo-metal complexes. In other words, firing can be accomplished at relatively low temperatures of 400° C. or greater. Thus, the present invention can be applied to many base materials such as low-melting-point glasses, etc., while degeneration or thermal denaturation of the base material is prevented.

Third, the metallic film formed after firing has a smooth mirror finish. Thus, the present invention shows good capability not only in decorative products, but also in fields that requires high precision such as electronic elements.

BEST MODE FOR CARRYING OUT THE INVENTION

The best mode for carrying out the present invention will be described below in the form of embodiments.

EMBODIMENT 1

Preparation of Gold Paste 40 parts of gold acetylide, 0.8 parts of bismuth naphthenate, 0.08 parts of rhodium acetylide, 6 parts of ethylcellulose and 38 parts of terpineol were kneaded together to produce a paste-form substance. The paste thus produced was passed through a mesh in order to remove debris. When this gold paste was applied to the surfaces of ceramics and glass by means of screen printing and was then fired, a lustrous gold-colored pattern was obtained.

EMBODIMENT 2

Preparation of Gold Paste 40 parts of gold acetylide, 5.5 parts of bismuth naphthenate, 0.08 parts of rhodium acetylide, 5 parts of nitrocellulose and 39 parts of butylcarbitol were kneaded together to produce a paste-form substance. This paste was passed through a mesh so that debris was removed. When this gold paste was applied to the surfaces of ceramics and glass by means of screen printing and was then fired, a lustrous gold-colored pattern was obtained.

EMBODIMENT 3

Preparation of Gold-Silver Paste 40 parts of gold acetylide, 5.5 parts of bismuth octylate, 10 parts of silver acetylide, 0.1 parts of rhodium acetylide, 4 parts of ethylcellulose, 15 parts of ethyl lactate and 20 parts of butylcarbitol were kneaded together to produce a paste-form substance. This paste was passed through a mesh so that debris was removed. When this gold-silver paste was applied to the surfaces of ceramics and glass by means of screen printing and was then fired, a pattern with a strong gold luster was obtained.

EMBODIMENT 4

Preparation of Gold Paste 14 parts of gold acetylide, 2.0 parts of bismuth octylate, 0.7 parts of silver acetylide, 0.028 parts of rhodium acetylide, 6 parts of ethyl cellulose, 4 parts of nitrocellulose, 30 parts of ethyl lactate and 40 parts of butylcarbitol were kneaded together to produce a paste-form substance. The paste thus produced was passed through a mesh in order to remove debris. When this gold paste was applied to the surfaces of ceramics and glass by means of screen printing and was then fired, a lustrous gold-colored pattern was obtained.

EMBODIMENT 5

Preparation of Gold-Platinum Paste 12 parts of platinum acetylide, 19 parts of gold acetylide, 3.3 parts of bismuth octylate, 0.048 parts of rhodium acetylide, 8 parts of ethylcellulose, 20 parts of ethyl lactate and 35 parts of butylcarbitol were kneaded together to produce a paste-form substance. The paste thus produced was passed through a mesh in order to remove debris. When this gold-platinum paste was applied to the surfaces of ceramics and glass by means of screen printing and was then fired, a pattern with a strong white metallic luster was obtained.

EMBODIMENT 6

Preparation of Palladium-Gold Paste 10 parts of palladium acetylide, 20 parts of gold acetylide, 3.8 parts of bismuth octylate, 0.05 parts of rhodium acetylide, 8 parts of ethylcellulose, 20 parts of ethyl lactate and 35 parts of butylcarbitol were kneaded together to produce a paste-form substance. The paste thus produced was passed through a mesh in order to remove debris. When this palladium-gold paste was applied to the surfaces of ceramics and glass by means of screen printing and was then fired, a pattern with a white metallic luster was obtained.

EMBODIMENT 7

Preparation of Gold Liquid 24 parts of gold acetylide, 3.3 parts of bismuth octylate, 0.048 parts of rhodium acetylide, 20 parts of copaiba balsam, 45 parts of ethyl lactate and 5 parts of DEP were kneaded together to produce a liquid-form substance. The gold liquid thus produced was filtered in order to remove debris. When this gold liquid was applied to the surfaces of ceramics and glass by means of painting with a brush and was then fired, a lustrous gold-colored pattern was obtained.

EMBODIMENT 8

Application of Gold Paste to Printer Thermal Head Electrode 36 parts of gold acetylide, 3.0 parts of bismuth naphthenate, 0.036 parts of rhodium acetylide, 7 parts of ethyl cellulose, 1 part of asphalt, 49 parts of butylcarbitol and 3 parts of DEP were kneaded together to produce a paste-form substance. The paste thus produced was passed through a mesh in order to remove debris. When this gold paste was patterned on the surface of a ceramic by means of screen printing and was then fired, a smooth gold pattern was obtained. When this gold pattern was used as an electrode in the thermal head of a printer, it was found that the resulting electrode was superior in terms of electrical conductivity.

EMBODIMENT 9

Application of Platinum Paste to Special Ceramic 60 parts of platinum acetylide, 8 parts of nitrocellulose and 32 parts of butylcarbitol acetate were kneaded together to produce a paste-form substance. The paste thus produced was passed through a mesh in order to remove debris. When this platinum paste was patterned on the surface of a special ceramic for semiconductor manufacture by means of screen printing and was then fired, a smooth platinum pattern was obtained. When this special ceramic was used as an electrode in a semiconductor manufacturing device, it was found that the resulting electrode was superior in terms of electrical conductivity.

EMBODIMENT 10

Application of Gold-Platinum Paste to Electrode of Electronic Element 17 parts of gold acetylide, 18 parts of platinum acetylide, 3.3 parts of bismuth octylate, 0.072 parts of rhodium acetylide, 4 parts of ethylcellulose, 15 parts of a petroleum type resin, 20 parts of terpineol, 20 parts of butylcarbitol and 5 parts of DEP were kneaded together to produce a paste-form substance. The paste thus produced was passed through a mesh in order to remove debris. When this gold-platinum paste was patterned on the surface of a ceramic by means of screen printing and was then fired, a smooth gold-platinum alloy pattern was obtained. When this pattern was used as an electrode in an electronic element, it was found that the resulting electrode was superior in terms of electrical conductivity; and it was further found that this pattern could also be utilized as an electrode in other electronic components.

EMBODIMENT 11

Application of Palladium-Gold Paste to Electrode of an Electronic Element 18 parts of gold acetylide, 12 parts of palladium acetylide, 2.5 parts of bismuth octylate, 0.04 parts of rhodium acetylide, 5 parts of ethylcellulose, 17 parts of a petroleum type resin, 15 parts of terpineol, 25 parts of butylcarbitol and 5 parts of DEP were kneaded together to produce a paste-form substance. The paste thus produced was passed through a mesh in order to remove debris. When this palladium-gold paste was patterned on the surface of a ceramic by means of screen printing and was then fired, a smooth palladium-gold alloy pattern was obtained. When this pattern was used as an electrode in an electronic component, it was found that the resulting electrode was superior in terms of electrical conductivity; and it was further found that this pattern could also be utilized as an electrode in other electronic elements.

The present invention is not limited to the above-described embodiments. Various modifications and design alterations, etc., which involve no departure from the technical spirit of the present invention, are included in the technical scope of the present invention.

INDUSTRIAL UTILIZATION

In the present invention, as described above in detail, a metallic composition for use in plating such as a metal liquid or metal paste is manufactured by using a metal acetylide compound expressed by the general formula $M(-C\equiv C-R)_n$ (in this formula, M indicates a metal atom, n indicates the valence number of the metal atom M, and R is a hydrocarbon group which may or may not contain oxygen atoms) as a metal source, and by kneading an organic solvent and/or a resin together with such a metal acetylide compound. Since metal acetylide compounds are readily soluble in various types of organic solvents, such compounds are suitable for use as metal raw materials in metallic compositions for use in plating. Furthermore, since these metal acetylide compounds contain no sulfur or halogen elements, these compounds release no environmental contaminants such as $SO_x$, halogens, etc. when fired. Thus, these compounds offer the advantage of contributing to the cleaning of the environment. As a result, there is no need for equipment such as desulfurizing apparatus, etc., and metallic films can be formed inexpensively. If such metal liquids or metal pastes are applied to base materials and fired, extremely smooth and finely textured metallic films are formed, and such films have a high degree of metallic luster. Accordingly, these films can be used for the decoration of ceramic vessels and glass utensils, etc. In addition, since the electrical conductivity of these metallic films is extremely good, the films can be used as electrodes in electronic components. Furthermore, in the case of metallic compositions that contains a plurality of metal acetylide compounds, high-performance metallic films which combine the advantages of the respective metals can be formed.

What is claimed is:

1. A metallic composition comprising:
   30 to 90 parts by weight of organic solvent;
   10 to 60 parts by weight of metal acetylide compounds expressed by the general formula $M(-C\equiv C-R)_n$ wherein, M indicates a metal atom, n indicates the valence number of the metal atom M, and R is a hydrocarbon group which may or may not contain oxygen atoms dissolved or disbursed in said organic solvent to form an organo-metal liquid, said metal acetylide compounds having a carbon number in the range of 3 to 8; and
   1 to 10 parts by weight of additives for heightening the adhesion of the metal film formed after firing mixed into the organo-metal liquid.

2. A metallic composition with a viscosity ranging from 50 to 5000 poise comprising:
   30 to 85 parts by weight of organic solvent;
   10 to 60 parts by weight of metal acetylide compounds expressed by the formula $M(-C\equiv C-R)_n$ wherein, M indicates a metal atom, n indicates the valence number of the metal atom M, and R is a hydrocarbon group which may or may not contain oxygen atoms dissolved or disbursed in said organic solvent to form an organo-metal liquid, said metal acetylide compounds having 4 carbon number in the range of 3 to 8;
   3 to 30 parts by weight of resin for adjusting the viscosity of the composition mixed into the organo-metal liquid to form an organo-metal paste; and
   1 to 10 parts by weight of additives for heightening the adhesion of the metal film formed after firing mixed into the organo-metal paste.

* * * * *